United States Patent [19]

Takahashi et al.

[11] Patent Number: 5,198,883
[45] Date of Patent: Mar. 30, 1993

[54] SEMICONDUCTOR DEVICE HAVING AN IMPROVED LEAD ARRANGEMENT AND METHOD FOR MANUFACTURING THE SAME

[75] Inventors: Kenji Takahashi, Tokyo; Yasuhiro Yamaji, Kanagawa; Susumu Harada, Kanagawa; Kazuichi Komenaka, Kanagawa; Mitsugu Miyamoto, Kanagawa; Masashi Muromachi, Kanagawa; Hiroshi Harada, Kanagawa; Kazuo Numajiri, Kanagawa; Haruyuki Shimakawa, Kanagawa; Toshiharu Sakurai, Kanagawa, all of Japan

[73] Assignee: Kabushiki Kaisha Toshiba, Kanagawa, Japan

[21] Appl. No.: 381,843

[22] Filed: Jul. 19, 1989

[30] Foreign Application Priority Data

Aug. 6, 1988 [JP] Japan .................. 63-196453

[51] Int. Cl.⁵ .................. H01L 21/60; H01L 23/28
[52] U.S. Cl. .................. 257/676; 257/673
[58] Field of Search .................. 357/70, 65, 68, 72, 357/74; 437/206

[56] References Cited

U.S. PATENT DOCUMENTS

| | | |
|---|---|---|
| 4,298,883 | 11/1981 | Komatsu et al. . |
| 4,330,790 | 5/1982 | Burns .................. 357/70 |
| 4,563,811 | 1/1986 | Cranston .................. 357/70 |
| 4,788,583 | 11/1988 | Kawahara .................. 357/70 |
| 4,791,473 | 12/1988 | Phy .................. 357/70 |
| 4,796,078 | 1/1989 | Phelps, Jr. et al. .................. 357/70 |
| 4,835,120 | 5/1989 | Mallik et al. .................. 437/220 |
| 4,907,129 | 3/1990 | Shimizu .................. 357/70 |
| 4,984,059 | 1/1991 | Kubota et al. .................. 357/70 |
| 5,072,280 | 12/1991 | Matsukura .................. 357/70 |

FOREIGN PATENT DOCUMENTS

| | | |
|---|---|---|
| 0108502 | 5/1984 | European Pat. Off. . |
| 0269336 | 6/1988 | European Pat. Off. .................. 357/70 |
| 2818080A1 | 11/1978 | Fed. Rep. of Germany . |
| 56-8862 | 1/1981 | Japan .................. 357/70 |
| 56-24959 | 3/1981 | Japan .................. 357/70 |
| 57-37841 | 3/1982 | Japan .................. 357/70 |
| 60-120543 | 6/1985 | Japan .................. 357/70 |
| 60-189958 | 9/1985 | Japan .................. 357/70 |
| 61-160957 | 7/1986 | Japan .................. 357/70 |
| 0085453 | 4/1987 | Japan .................. 357/70 |
| 62-142388 | 12/1987 | Japan . |
| 63-15454 | 1/1988 | Japan .................. 357/70 |
| 63-44750 | 2/1988 | Japan .................. 437/220 |
| 63-95639 | 4/1988 | Japan .................. 357/70 |
| 1-69041 | 3/1989 | Japan .................. 357/70 |
| 1-123427 | 5/1989 | Japan . |
| 1-123428 | 5/1989 | Japan . |
| 2-246257 | 10/1990 | Japan . |
| 9015438 | 12/1990 | PCT Int'l Appl. . |

Primary Examiner—Andrew J. James
Assistant Examiner—Viet Q. Nguyen
Attorney, Agent, or Firm—Finnegan, Henderson, Farabow, Garrett and Dunner

[57] ABSTRACT

First and second frame bodies are used to fabricate a semiconductor device. The first frame body includes a die pad. The second frame body only includes a plurality of leads. The die pad is depressed by a predetermined amount which is equal or greater than the thickness of a semiconductor chip to be mounted on the die pad. The two frame bodies are welded, and wire bonding and cutting of the leads are performed.

13 Claims, 9 Drawing Sheets

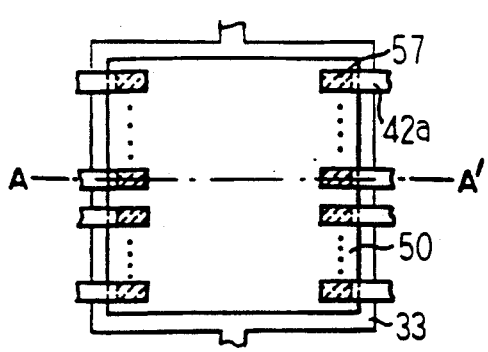
FIG.5A.
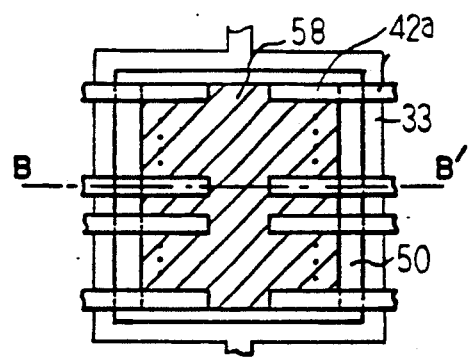
FIG.6A.
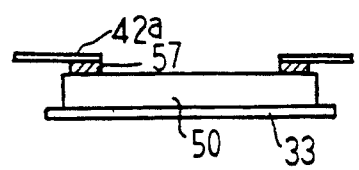
FIG.5B.
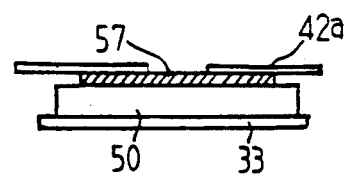
FIG.6B.
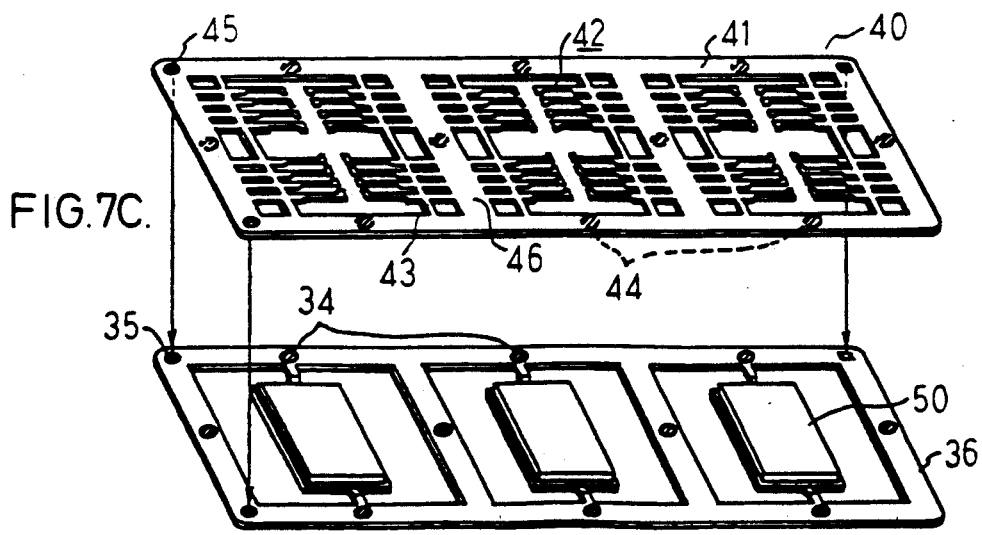
FIG.7A.
FIG.7B.
FIG.7C.

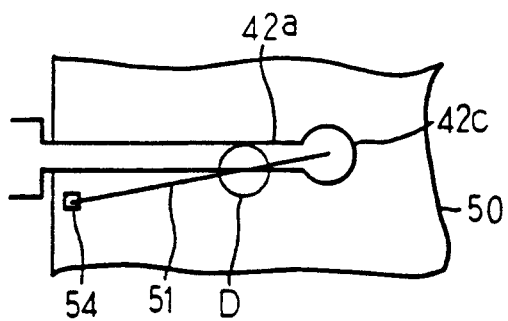
F I G.10A.
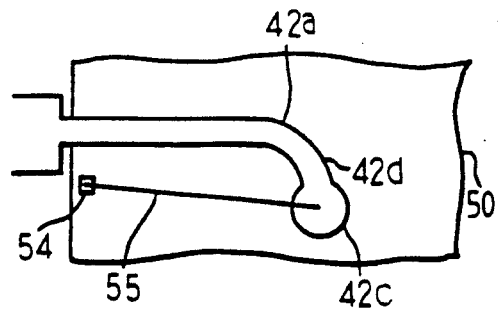
F I G.10B.
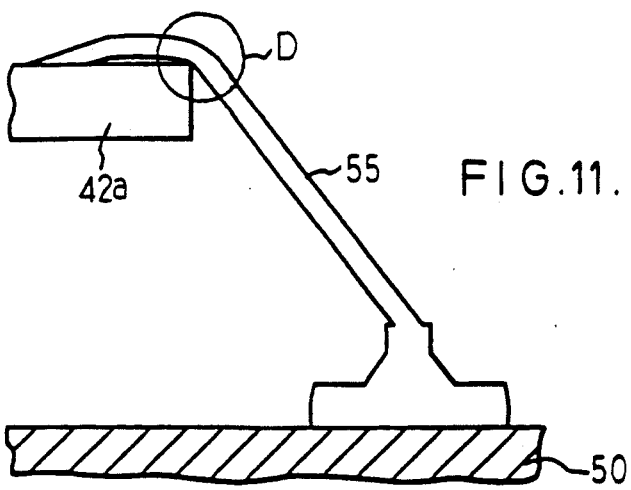
F I G.11.
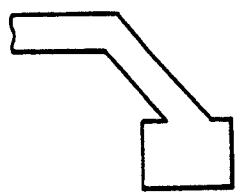
F I G.12A.
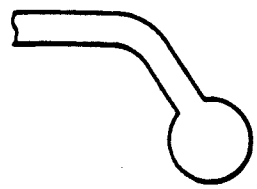
F I G.12B.

SEMICONDUCTOR DEVICE HAVING AN IMPROVED LEAD ARRANGEMENT AND METHOD FOR MANUFACTURING THE SAME

BACKGROUND OF THE INVENTION

1. Field of the Invention

This invention concerns a lead frame, a semiconductor device manufactured by using the lead frame, and a method for manufacturing the semiconductor device.

2. Description of the Prior Art

Recently, the demand for high integration of semiconductor devices has increased. On the other hand, there is also a demand for reduction of the external dimensions of the semiconductor device after sealing. Since the semiconductor chip size is becoming larger to meet the demand for high integration, the reduction of the external dimensions is very difficult. Many efforts have been made to reduce the external dimensions.

FIGS. 1A to 1E show a conventional lead frame and a semiconductor device produced by using the lead frame, shown in Japanese laid open Patent (Tokkai Sho) No: 52-127756. In the prior art, two metalic frame bodies 10 and 20 are used. The first metalic frame body 10 includes a die pad portion 13 and tie bars 12 connecting the die pad portion 13 to a joining band 11. FIG. 1C is a cross sectional view along the line A-A' of FIG. 1B. The second metalic frame body 20 has projecting portions 23 and a plurality of leads 25 extending from a lead connecting portion 24 to the central portion. A dam bar portion 22 supports the leads 25 (FIG. 1B, FIG. 1C). A semiconductor chip 15 is mounted on the die pad portion 13. (FIG. 1D)

The die pad portion 13 is separated from the joining band 11 by cutting along the line B-B'. The die pad portion 13 having the semiconductor chip 15 is welded to the projecting portion 23, and is fixed to the second frame body 20. (FIG. 1E)

Bonding pads (not shown) on the semiconductor chip 15 are electrically connected to the inner lead portions of the leads 25 by bonding wires (not shown).

Since the inner lead portions of the leads 25 overlap the semiconductor chip 15, it is possible to reduce the external dimensions of the semiconductor device as compared to devices wherein the die pad portion and the leads are produced from a single frame body.

However, in the prior art, the die pad portion 13 is separated from the joining band after the semiconductor chip is mounted thereon. Thus, there is a problem of dust adhering to the semiconductor chip during the separation process. Furthermore, there is a problem in handling the frame bodies due to the projecting portions 23, since the projecting portions 23 serve as hooks when the frame bodies are piled up during the manufacturing process.

SUMMARY OF THE INVENTION

Therefore, an object of the present invention is to provide an improved frame body which is free from the dust problem and is easy to handle during the fabrication of the semiconductor devices.

Another object of the present invention is to provide a semiconductor device having an improved lead arrangement using the improved frame body.

A further object of the present invention is to provide a method for manufacturing the semiconductor device disclosed herein.

To achieve these objects, this invention provides a frame body for manufacturing a semiconductor device including a semiconductor chip, comprising: first frame means including; a die pad portion having a main surface for supporting the semiconductor chip; a first frame portion having a first surface, surrounding the die pad portion; connecting means for connecting the die pad portion to a predetermined portion of the first frame portion so as to produce an offset between the main surface and the first surface; and second frame means having a second frame portion; a central portion surrounded by the second frame portion; and a plurality of lead portions extending from the second frame portion to the central portion so as to overlap the semiconductor chip when the first and the second frame bodies are combined.

Furthermore, this invention provides a semiconductor device comprising: a semiconductor chip having a plurality of bonding pads formed on a main surface thereof; semiconductor chip supporting means, including a die pad portion having a first surface for supporting the semiconductor chip, a die pad supporting portion having a second surface, a tie bar portion for producing a predetermined offset between the second surface of the die pad supporting portion and the first surface of the die pad portion; a plurality of inner leads, each having third and fourth surface, the fourth surface being coincident with a plane formed by the second surface of the die pad supporting portion and overlapping the semiconductor chip on the main surface; and a plurality of bonding wires for connecting the third surface of the inner lead to the corresponding bonding pad.

Moreover, this invention provides a process for manufacturing a semiconductor device, comprising the steps of: preparing a first frame body including a die pad portion for supporting a semiconductor chip; a first frame portion surrounding the die pad portion; and connecting means for connecting the die pad portion to the first frame portion; preparing a second frame body including a second frame portion; a central portion surrounded by the second frame portion; a plurality of lead portions extending from the second frame portion to the central portion; mounting a semiconductor chip having a plurality of bonding pads on a main surface thereof on the die pad portion of the first frame body; welding the first and the second frame bodies; connecting the bonding pads on the semiconductor chip to the lead portions of the second lead frame body; and separating the lead portions and the die pad portion from the first and second frame bodies.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings:

FIG. 5A is a plan view showing a still further embodiment according to the present invention, and FIG. 5B is a cross sectional view along the line A-A' in FIG. 5A.

FIG. 6A is a plan view of another embodiment according to the present invention, and FIG. 5B is a cross sectional view along the line B-B' in FIG. 6A.

FIGS. 10A and 10B are diagrams illustrating a problem of contact between the inner leads and the bonding wires.

FIG. 11 is a diagram also used to illustrate a contact problem between the inner leads and the bonding wires.

FIGS. 12A and 12B are drawings for explaining a preferred shape of the inner leads.

DETAILED DESCRIPTION OF THE INVENTION

Figure 1A:
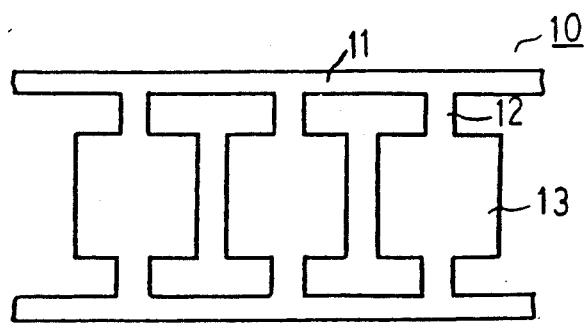
FIGS. 1A to 1E show a conventional frame body.
Figures 1B, 1C:
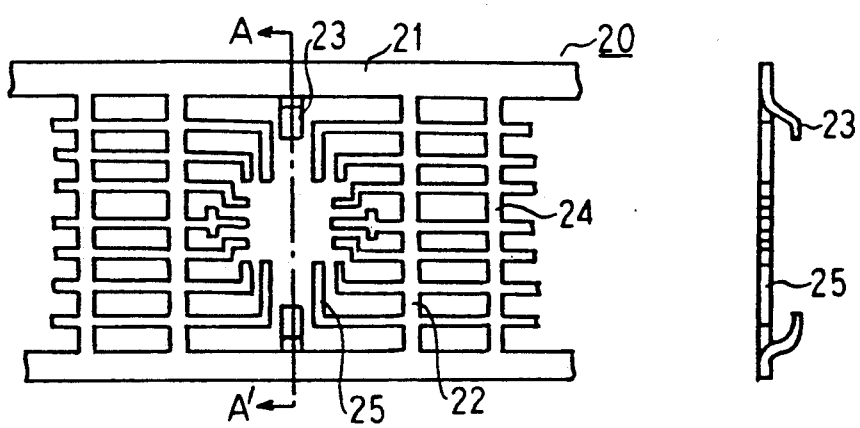
Figure 1D:
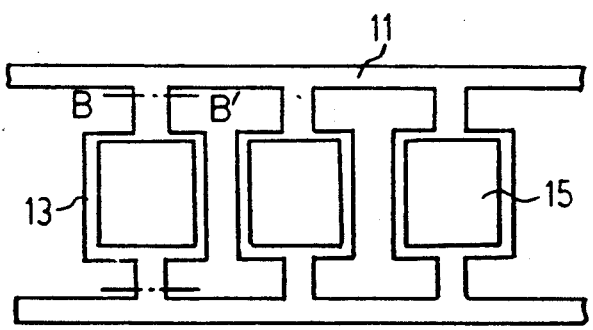
Figure 1E:
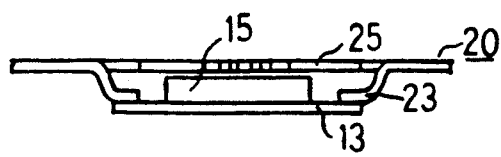

Referring now to the drawings, the present invention will be explained.

Figure 2A:
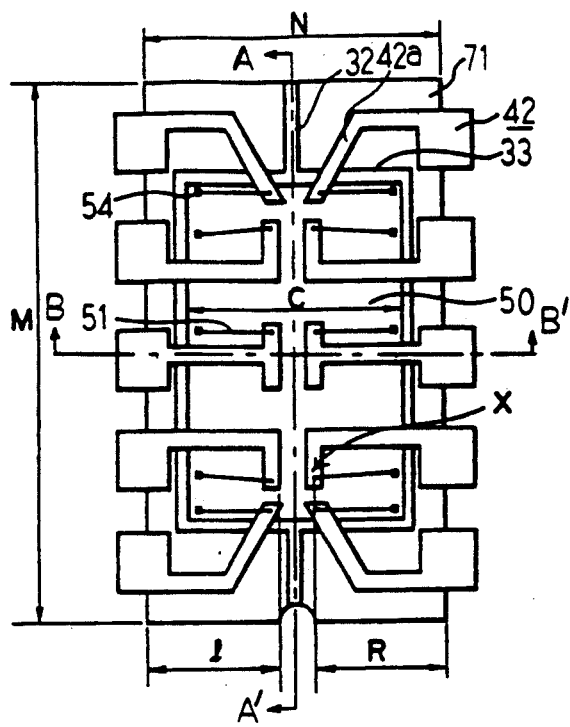
FIG. 2A is a plan view of a semiconductor device according to the present invention.
Figure 2B:
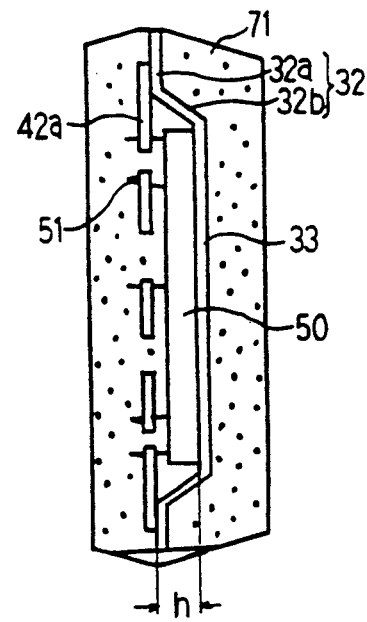
FIGS. 2B and 2C are cross sectional views along the lines A-A' and B-B' in FIG. 2A, respectively.
Figure 2C:
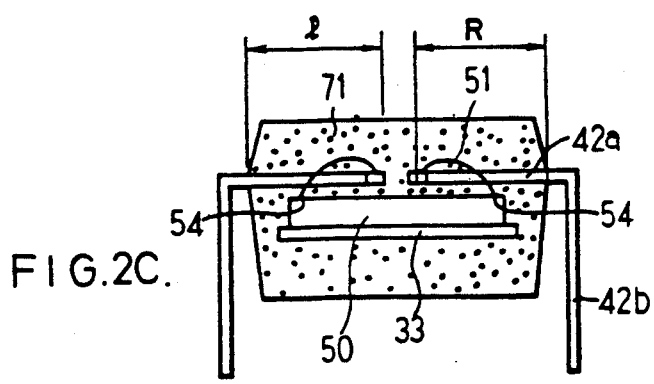

FIG. 2A is a plan view of a semiconductor device according to the present invention, with plastic housing 71 removed for ease of explanation. FIGS. 2B and 2C are cross sectional views along the lines A-A' and B-B' in FIG. 2A, respectively. In the semiconductor device, a semiconductor chip 50 is mounted on a die pad portion 33 and is fixed thereon by a conductive glue (not shown). The die pad portion 33 is formed by depressing and deforming a tie bar 32. A connecting portion 32b of the tie bar 32 produces a predetermined offset h between the surfaces of the die pad portion 33 and a die pad supporting portion 32a. The offset h is established to be equal or greater than the thickness of the semiconductor chip 50.

A plurality of inner leads 42a are extended inwardly so as to overlap the semiconductor chip 50. In the fabrication of the semiconductor device according to the present invention, two separate frame bodies are used for the inner leads 42a and the die pad 33, respectively. Thus, the lower surface of the inner leads 42a is coincident with the upper surface of the die pad supporting portion 32a. The details of this construction will be provided in the explanation of the method for manufacturing the semiconductor device, given later.

The head portion of the respective inner lead 42a and the corresponding bonding pad 54 formed on the periphery of the semiconductor chip 50 are electrically connected by a bonding wire 51. The device is molded with a plastic resin to form a plastic housing 71.

In the semiconductor device, the relationship between the width N of the plastic housing 711 and the width C of the semiconductor chip 50 is expressed as follows.

$$C < N - \alpha \quad (1)$$

wherein $\alpha$ is a margin. Since the inner leads 42a overlap the semiconductor chip 50, the width C can be made relatively large when compared to a well known conventional device where the inner leads and the die pad are formed from a single frame body.

Furthermore, the distance R from the edge of the plastic housing 71 to the bonding position X of the inner lead 42a can be expressed as follows.

$$R < N - \beta \quad (2)$$

wherein $\beta$ is a margin.

As is apparent from the equation (2), the distance R is not influenced by the semiconductor chip width C. Thus, it is possible to make the length of the bonding wire longer. Therefore, the path of moisture from the outside to the wire bonding portion becomes longer, and the invasion of moisture can be prevented. Thus, the reliability against moisture damage is increased.

Figure 3:
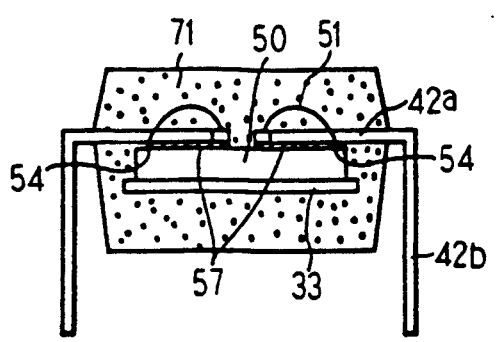
FIG. 3 is a cross sectional view showing another embodiment according to the present invention.

FIG. 3 is a cross sectional view of another embodiment according to the present invention. In this embodiment, an insulating tape 57 is formed between the inner leads 42a and the semiconductor chip 50. The insulating tape 57 is made of, e.g., polyimide, and is pasted on the inner leads 42a. In this embodiment, the bonding process between the inner leads 42a and the bonding pads 54 can be performed in safety, since the insulating tape 57 absorbs the stress caused by the bonding when the bonding wire 51 is bonded to the inner leads 42a. Thus, the passivation layer (not shown) on the semiconductor chip can be protected from problems, such as cracking.

Figure 4:
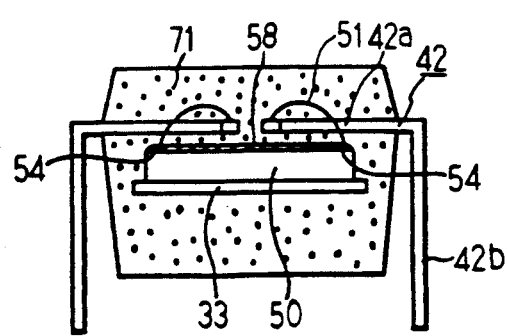
FIG. 4 is a cross sectional view showing yet another embodiment according to the present invention.

FIG. 4 is a cross sectional view of a further embodiment according to the present invention. In this embodiment, an insulating buffer coating 58 is formed on the semiconductor chip 50. The coating 58 is made of insulating material, such as, e.g., polyimide or polyurethane. The coating is formed by a spin coating on the semiconductor chip having a passivation pads 54 formed on the semiconductor chip 50, for example. In this embodiment, the coating 58 absorbs the stress on the semiconductor chip when the inner leads 42a contact the semiconductor chip 50 during the wire bonding. Thus, the passivation layer on the semiconductor chip can be protected from cracking.

FIGS. 5A to 6B are drawings showing examples of patterns of the insulating tape 57. In FIGS. 5A and 5B, the insulating tape 57 is formed selectively only on the edge portion serving as a bonding area of the inner leads 42a.

On the other hand, in FIGS. 6A and 6B, the insulating tape 57 is relatively wide, and is formed to support all inner leads 42a. Thus, the stress on the semiconductor chip 50 during the bonding process can be reduced, and the wire bonding can be performed safely.

Next, the manufacturing process used to make a semiconductor device having an improved frame body will be explained with reference FIGS. 7A to 7J.

At first, a first frame body 30 is prepared. The first frame body 30 includes a joining bar 31, supporting bar 36 extending perpendicular from the joining bar 31, and a die pad portion 33 connected to the joining bar 31 by a tie bar 32. The die pad portion 33 is depressed downwardly by at least a semiconductor chip height. The joining bar 31 and the supporting bar 36 form a closed loop to surround the die pad portion 33. Furthermore, the joining bar 31 is plated with tin 34 at selective locations. It is preferable to form one tin plated portion 34 on each side of the frame body which surrounds the die pad portion 33. The diameter of the tin plated portion is about 3 to 5 mm. The first frame body 30 further includes a plurality of indexing holes 35. (FIG. 7A)

Next, semiconductor chips 50 are mounted on the corresponding die pad portions 33. (FIG. 7B)

Then, a second frame body 40 is prepared. The second frame body 40 includes joining bar 41 and a plurality and leads 42. The leads 42 are supported by dam bar 43, and extend inwardly from a lead connecting portion 46. The second frame body 40 also has tin plated portions 44 corresponding to the tin plated portions 34 of the first frame body 30 and indexing holes 45 corresponding to the indexing holes 35 of the first frame body 30. (FIG. 7C)

Figure 7D:
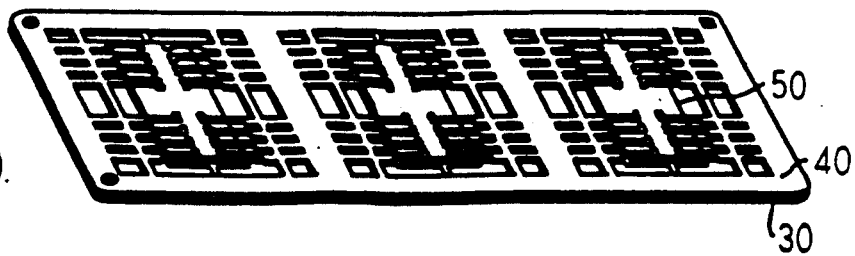
FIGS. 7A and 7J are diagrams illustrating a method of manufacturing a semiconductor device according to the present invention.

Next, the second frame body 40 is put on the first frame body 30 with indexing holes 35 and 45 aligned. Then, a resistance welding is performed at the positions where the tin is plated. (FIG. 7D)

In the case where a calking is used for joining of the first and the second frame bodies, the frame bodies are easily deformed. On the other hand, such deformation can be prevented using the above described welding technique. Generally, copper materials are used for the frame body rather than 42 alloy (Fe-Ni(42%)) for easy processability. However, such copper materials have a good electric conductivity and a low thermal resistance. Thus, the heat generated during the welding is small and the head is easily dissipated. When a large current is used for the welding to get enough heat, there is a problem of the welding electrode sticking to the frame body.

On the other hand, when the tin is used, it is not necessary to rise the welding temperature so high, since the tin has a relatively low melting point. It is preferable to choose the sum of the thickness of the tin of the first and the second frame bodies to be about 3 to 5 $\mu$m. Besides the tin, it is possible to use a material of a low melting point (e.g., 300° C.), a low electric conductivity, a low thermal conductivity and easily forming an alloy with the frame body, such as tin based alloy, e.g., solder (Pb-Sn), Au-Sn.

In this case, it is possible to sandwich a sheet material having the above mentioned characteristic between the first and the second frame bodies, instead of the plating.

Furthermore, it is possible to plate only one of the frame bodies, and also to plate the whole surface of the frame body.

Figure 7E:
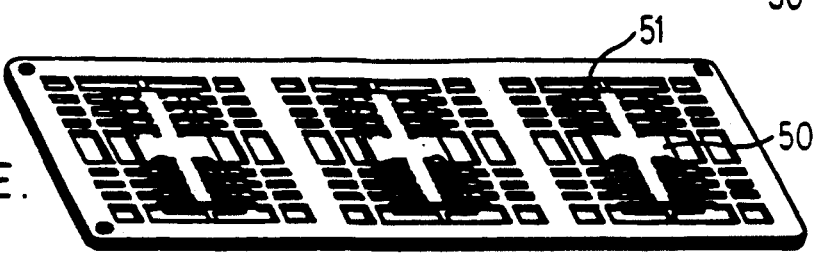

Next, the wire bonding process is performed by connecting the bonding pads on the semiconductor chip 50 and the inner leads 42a by bonding wires 51. (FIG. 7E)

Figure 7F:
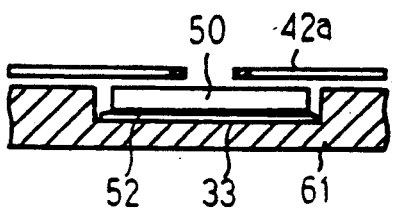
Figure 7G:
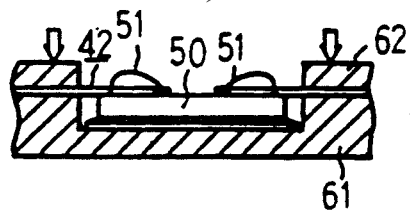

FIGS. 7F and 7G show the process of wire bonding. A conductive glue 52 for fixing the semiconductor chip 50 to the die pad 33 is provided. The die pad 33 is put on a heater block 61. (FIG. 7F). Since the inner leads 42a are made from the first frame body, namely upper side frame body 40, there is a slight gap between the surface of the heater block 61 and the inner leads 42a. Thus, to perform the wire bonding process safely, the inner leads 42a are fixed to the surface of the heater block 61 by a forcing member 62. After the wire bonding, the forcing member 62 is taken away. The inner leads 42a return to their original position due to the elasticity thereof. Therefore, a gap is formed between the surface of the semiconductor chip 50 and the inner leads 42a.

Figure 7H:
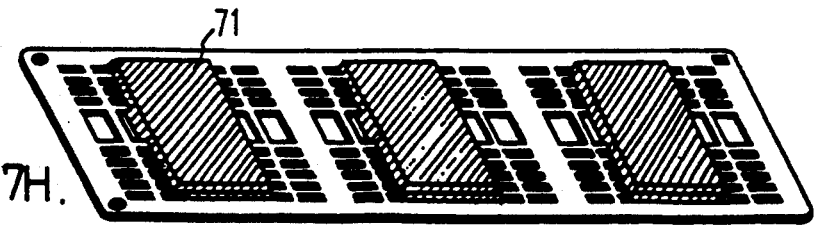

Then, a molding process is performed using, e.g., a transfer mold method, to achieve a plastic housing 71. (FIG. 7H)

Figure 7I:
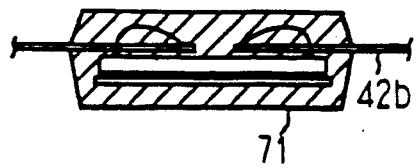

Next, a plating of the outer leads 42b with solder, a removal of dam bar 43 and a cutting of the leads from the lead connecting portion are performed. (FIG. 7I)

Figure 7J:
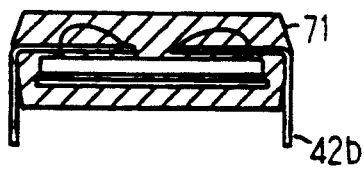

Then, the outer leads 42b are bent to obtain a final product. (FIG. 7J)

Figure 8B:
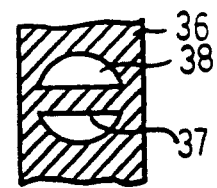
FIGS. 8A to 8D are diagrams for explaining a joint portion between a first frame body and a second frame body.
Figure 8A:
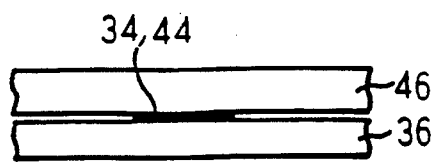
Figure 8C:
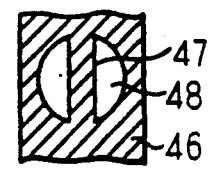
Figure 8D:
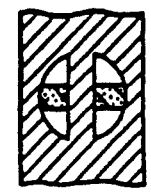

FIGS. 8A to 8D are drawings showing an example of the shape of the tin plated joint portion of the first frame body 30 and the second frame body 40. To simplify the explanation, a joint portion formed in the supporting bar 36 of the first frame body 30 and the lead connecting portion 46 of the second frame body 40 are illustrated as an example. As shown in FIG. 8B, the supporting bar 36 of the first frame body 30 has an opening 38 for forming a lateral bar portion 37. The lead connecting portion 46 of the second frame body 40 has an opening 48 for forming a vertical bar portion 47. Thus, when the first and the second frame bodies are joined, the bar portions overlap in cross shape and contact at a relatively small area. Therefore, the heat during the welding may be concentrated at a small area, and the welding can be performed effectively.

It should be noted that in this invention, the first frame body having the semiconductor chip thereon is combined with the second frame body. Namely, there is not cutting process of the tie bar before the molding. Thus, the dust problem due to the cutting, which occurred in the prior art, can be prevented.

Figure 9:
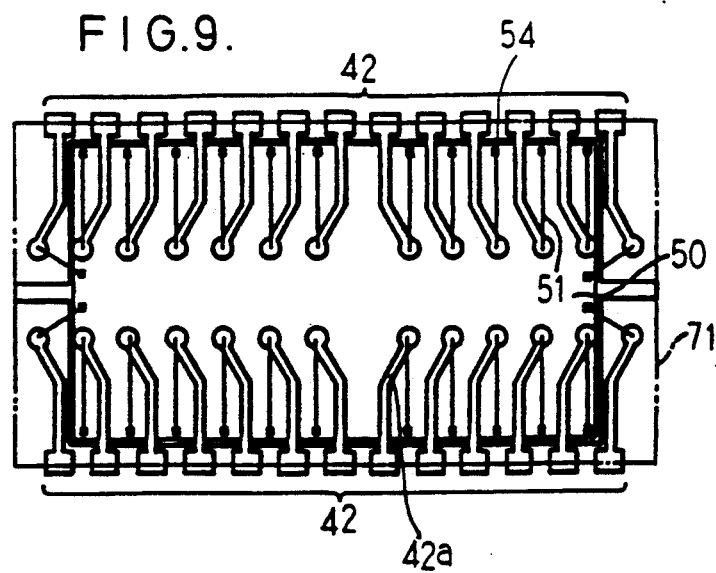
FIG. 9 is a plan view illustrating a preferred arrangement of the bonding pads formed on a semiconductor chip and the inner leads.

FIG. 9 is a plan view illustrating the relationship between the bonding pads 54 formed on the semiconductor chip 50 and the inner leads 42a. As shown in the drawing, each inner lead 42a extends inwardly through the space between the adjacent bonding pads 54. Each head portion of the respective inner lead 42a is bent towards the bonding pad to be connected electrically therewith.

FIGS. 10A, 10B and 11 are enlarged drawings for explaining why it is preferable to bend the inner leads 42a. In the case where the inner lead 42a is straight, there is a crossing D of the inner lead 42a and the bonding wire 51, as shown in FIG. 10A. Thus, in the case where the bonding wire is not long enough, there is a risk of contact between the inner lead 42a and the bonding wire 51 during the wire bonding process between the bonding pads 54 and the head portion 42c of the inner leads 42a, as shown in FIG. 11. As previously explained, since the inner leads go back to the original position after the wire bonding process, the bonding wire will be pulled by the inner lead 42a, and is sometimes will be broken due to the pull strength. Therefore it is preferable to bend the lead 42a at a predetermined portion 42d to avoid the contact.

FIGS. 12A and 12B are drawings for explaining the preferred shape of the inner leads. In FIG. 12A, the inner lead is angular. On the other hand, the inner lead in FIG. 12B is rounded. If the inner leads contact the semiconductor chip during the wire bonding process, a stress will be applied to the semiconductor chip. If the inner leads are rounded, the stress is dispersed and the risk of cracks in the passivation layer on the semiconductor chip can be lowered. Thus, it is preferable to round the corners of the inner leads.

Figure 13:
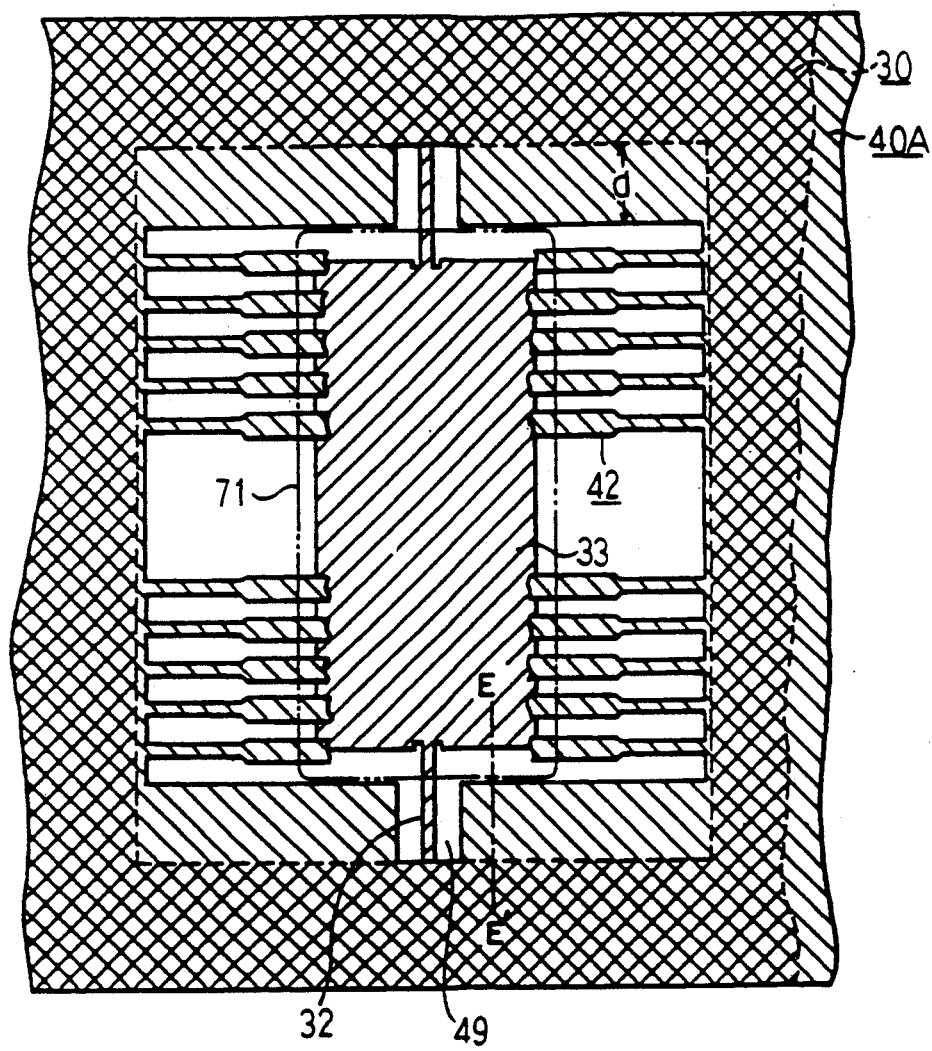
FIG. 13 illustrates an embodiment according to the present invention, wherein notches are formed in the frame body.

FIG. 13 is a plan view of another embodiment according to the present invention. In this embodiment, the second frame body 40A having a plurality of leads 42 has a notch 49 to increase the length of the tie bar 32. Furthermore, the inner dimensions of the first frame body 30 and the second frame body 40A are different. Namely, the first frame body 30 has a wider inner dimension than the second frame body 40A by d.

Figure 14:
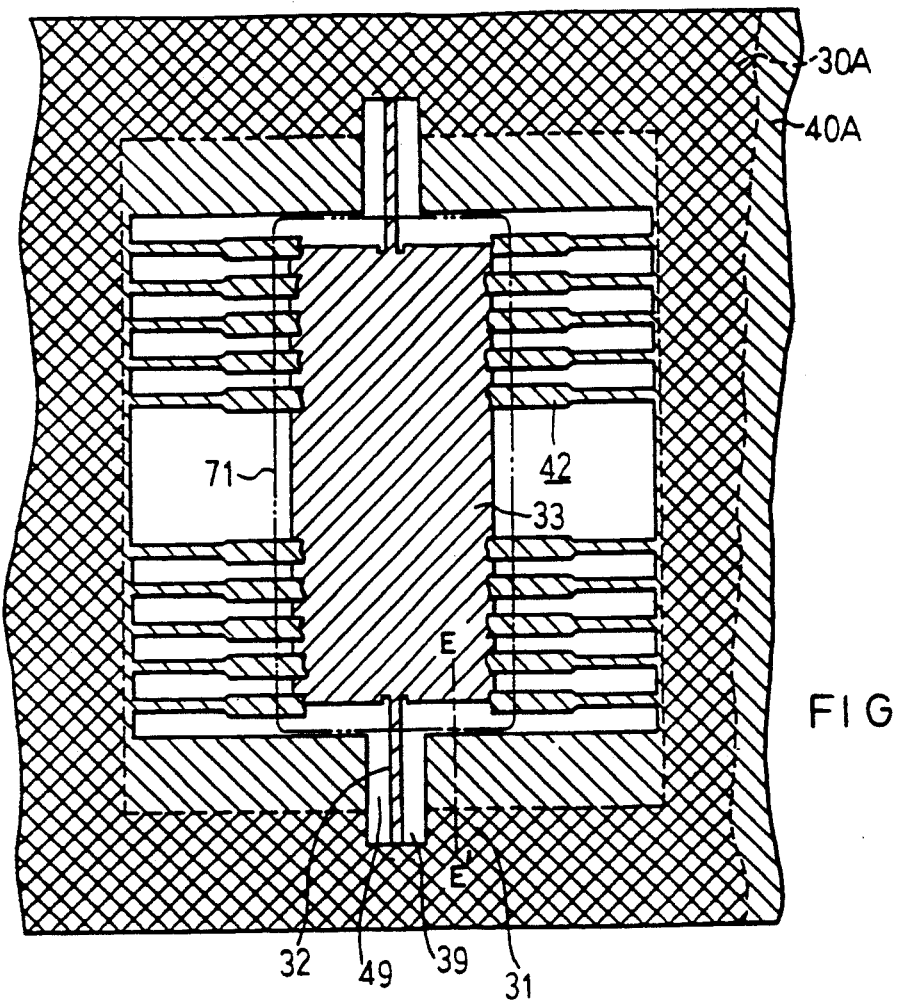
FIG. 14 illustrates yet another embodiment according to the present invention, wherein notches are formed in the frame body.

In FIG. 14, the joining bar 31 of the first frame body 30A has a notch 39 to increase the length of the tie bar 32. The second frame body 40A also includes a notch 49 corresponding to the notch of the first frame body 30. Thus, the tie bar may be lengthened.

Figure 15A:
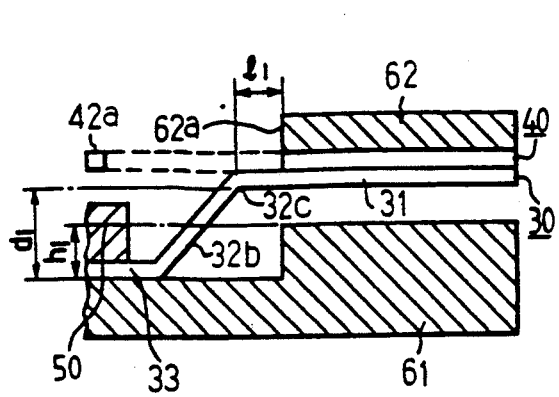
FIGS. 15A and 15B are drawings for explaining a problem when the tie bar is relatively short.
Figure 15B:
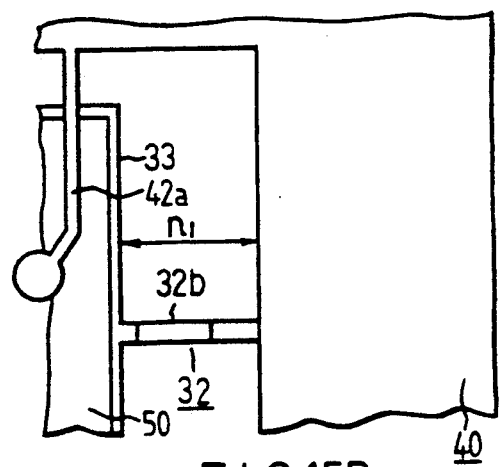

FIGS. 15A to 16B are drawings for explaining why it is useful for the tie bar to be made longer. When the tie bar 32 is short, i.e., n1 as shown in FIGS. 15A and 15B, it is hard to deform the tie bar 32 by pressing the inner lead 32 with the forcing member 62 during the wire bonding process. Thus, in the case where the height d1 from the lower surface of the die pad 33 to the lower surface of the joining bar 31 is higher than the height h1 of the wall of the heater block 61, the frame bodies are not well fixed to the heater block 61 and the forcing member 62. Therefore, the wire bonding may be performed with a gap between the heater block 61 and the forcing member 62.

Figure 16A:
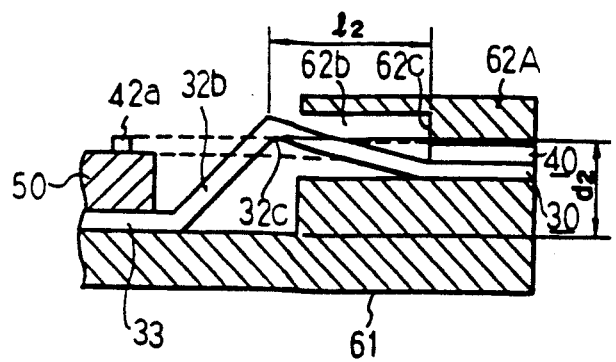
FIGS. 16A and 16B are drawings for explaining the case where the tie bar is relatively long.
Figure 16B:
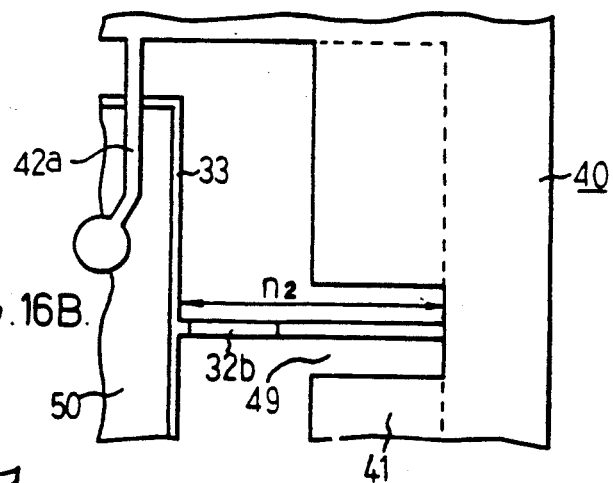

In FIG. 16B, a notch 49 is formed at the joining bar 41 to increase the length of the tie bar 32 to n2. Furthermore, the forcing member 62A has an escape zone 62b, as shown in FIG. 15A. When stress is applied to the frame bodies 30 and 40, the deformation of the tie bar is easily achieved, since the tie bar 32 is made longer and the distance between the edge 62c of the forcing member 62A and the deformed point 32c is made longer to 12. Thus, the frame bodies are fixed tightly to the heater block 61 by the forcing member 62A, and the wire bonding is performed in a stabilized condition. The escape zone 62b allows the easy deformation of the tie bar 32.

Figure 17:
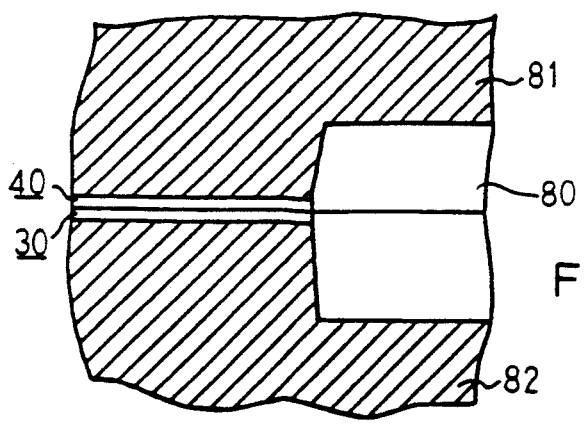
FIGS. 17 and 18 are cross sectional views for explaining the reason why the dimensions of first and second frame bodies are different in the embodiment of FIG. 13.
Figure 18:
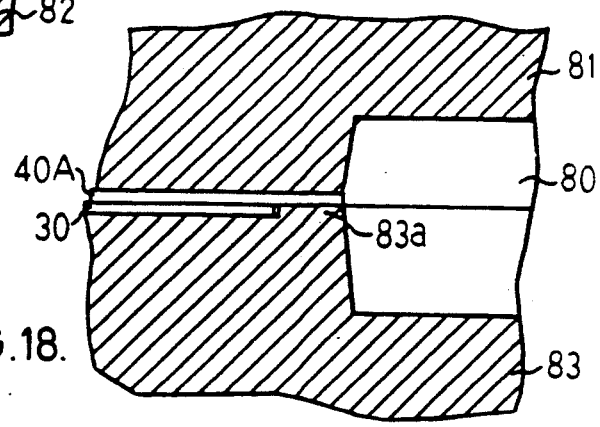

FIGS. 17 and 18 are diagrams for explaining the reason why the inside dimensions of the first and the second frame bodies are different in the embodiments of FIG. 13 and FIG. 14. FIG. 17 and 18 correspond to cross sectional views along the line E—E' in FIG. 13.

If the inside edges of the molding dies 81 and 82 are coincident with the edges of the first frame body 30 and 40, the mold resin (not shown) injected into the cavity 80 sometimes flows out through the slit between the two frame bodies to form a burr between the adjacent inner leads. Thus, additional steps, such as removing of the burr sticking to the leads, are required. Furthermore, the resin sometimes causes serious problem during the cutting and bending process, or lowers the reliability of the wire connection.

To prevent the problem, the first frame body 30 is widened by d (corresponding to the length of the notch 49 in FIG. 13), e.g., 0.2 mm, with respect to the second frame body 40 in the embodiment of FIG. 13. With this arrangement, it is possible to fabricate a projecting portion 83a to hold the second frame body 40 with the upper molding die 81. The projecting portion 83a prevents the flow of the mold resin, and the reliability and the efficiency of the molding process can be increased.

The present invention has been described with respect to a specific embodiment. However, other embodiments based on the principles of the present invention should be obvious to those of ordinary skill in the art. Such embodiments are intended to be covered by the claims.

What is claimed is:

1. A frame assembly body comprising:
   a semiconductor chip having a plurality of bonding pads formed along at least a first edge of a main surface of the semiconductor chip;
   a first frame including a die pad portion having a main surface supporting the semiconductor chip;
   a second frame, integrally attached to the first frame, including a plurality of laterally spaced inner leads, each of the inner leads including an arm portion having edges extending along a longitudinal axis and overlapping said at least first edge and spaced above the main surface of the semiconductor chip, each said arm portion terminating at a head portion disposed inwardly of said at least first edge, each of the arm portions of the inner leads being substantially parallel to one another, and the head portion of each inner lead being laterally offset from the longitudinal axis and edges of the arm portion of that inner lead in alignment with a respective one of the bonding pads; and
   a plurality of bonding wires, each of the bonding wires connecting a respective one of the head portions of the inner leads to the bonding pad with which the respective head portion is aligned and extending along a path offset from adjacent arm portions of the inner leads.

2. A frame body according to the claim 1, wherein:
   the firs frame further includes a first portion, having a first surface, which surrounds the die pad portion, and connecting means connecting the die pad portion to a predetermined portion of the first portion of the first frame and maintaining an offset between the main surface of the die pad portion and the first surface of the first portion of the frame;
   the second frame further includes the plurality of inner leads, a first portion, and a central portion surrounded by the first portion of the second frame; and
   the plurality of leads extend from the first portion of the second frame to the central portion and overlap the semiconductor chip.

3. The frame body assembly according to claim 2, further comprising an insulating buffer layer formed on each inner lead.

4. The frame body assembly according to claim 2, wherein the first portion of the first frame and the first portion of the second frame are made of a metal having a first melting point, and the first portion of the first frame and the first portion of the second frame are partially plated with a specified metal layer which has a second melting point which is lower than the first melting point.

5. The frame body assembly according to claim 4, wherein the first portion of the first frame and the first portion of the second frame are made of copper based material, and the specified metal layer is made of tin.

6. The frame body assembly according to claim 2, wherein the first portion of the second frame includes a first notch portion at an area corresponding to said predetermined portion of the first portion of the first frame.

7. The frame body assembly according to claim 6, wherein the first of the first frame portion includes a second notch portion for increasing the length of the connecting means.

8. The frame body assembly according to claim 2, wherein the first portion of the first frame has a first predetermined inner dimension and the first portion of the second frame has a second predetermined inner dimension, and the first predetermined inner dimension is wider than the second predetermined inner dimension by a predetermined amount.

9. A semiconductor device comprising:
a semiconductor chip having a plurality of bonding pads formed along at least a first edge on a main surface of the semiconductor chip;
semiconductor chip supporting means supporting the semiconductor chip, the semiconductor chip supporting means including a die pad portion having a first surface;
a plurality of laterally spaced inner leads, each of the inner leads including an arm portion having edges extending along a longitudinal axis and overlapping said at least first edge and spaced above the main surface of the semiconductor chip, each said arm portion terminating at a head portion disposed inwardly of said a least first edge, each of the arm portions of the inner leads being substantially parallel to one another, and the head portion of each inner lead being laterally offset from the longitudinal axis and edges of the arm portion of that inner lead in alignment with a respective one of the bonding pads; and
a plurality of bonding wires, each of the bonding wires connecting a respective one of the head portions of the inner leads to the bonding pad with which the respective head portion is aligned and extending along a path offset from adjacent arm portions of the inner leads.

10. A semiconductor device according to claim 9, wherein:
the semiconductor chip supporting means comprises a die pad supporting portion, having a first surface, and a connecting portion connecting the die pad supporting portion and the die pad portion and maintaining a predetermined offset between the first surface of the die pad supporting portion and the first surface of the die pad portion; and
each of the inner leads has a first surface and a second surface, at least one of the second surfaces of the inner leads is coincident with the first surface of the die pad supporting portion, and the second surfaces of the inner leads overlap the main surface of the semiconductor chip.

11. The semiconductor device according to claim 10, further comprising an insulating buffer layer between each inner lead and the main surface of the semiconductor chip.

12. The semiconductor device according to claim 11, wherein the insulating buffer layer is formed between each inner leads.

13. The semiconductor device according to claim 10, wherein the insulating buffer layer is formed on the main surface of the semiconductor chip.

* * * * *

UNITED STATES PATENT AND TRADEMARK OFFICE
CERTIFICATE OF CORRECTION

PATENT NO. : 5,198,883
DATED : March 30, 1993
INVENTOR(S) : Kenji Takahashi et al.

It is certified that error appears in the above-indentified patent and that said Letters Patent is hereby corrected as shown below:

Claim 2, column 8, line 33, change "firs" to --first--.

Claim 7, column 8, line 68, after "first" delete --of the first frame-- and after "portion" insert --of the first frame--.

Claim 9, column 9, line 25, change "a least" to --at least--.

UNITED STATES PATENT AND TRADEMARK OFFICE
CERTIFICATE OF CORRECTION

PATENT NO. : 5,198,883

DATED : March 30, 1993

INVENTOR(S) : Kenji Takahashi et al

It is certified that error appears in the above-indentified patent and that said Letters Patent is hereby corrected as shown below:

Column 10, line 28, after "each" insert --of the--

Signed and Sealed this

Third Day of May, 1994

Attest:

BRUCE LEHMAN

Attesting Officer

Commissioner of Patents and Trademarks